(12) United States Patent
Hwang et al.

(10) Patent No.: US 9,543,391 B2
(45) Date of Patent: Jan. 10, 2017

(54) HIGH ELECTRON MOBILITY TRANSISTOR HAVING REDUCED THRESHOLD VOLTAGE VARIATION AND METHOD OF MANUFACTURING THE SAME

(75) Inventors: In-jun Hwang, Hwaseong-si (KR); Jae-joon Oh, Seongnam-si (KR); Jae-won Lee, Seoul (KR); Hyo-ji Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 55 days.

(21) Appl. No.: 13/517,815

(22) Filed: Jun. 14, 2012

(65) Prior Publication Data

US 2013/0099285 A1   Apr. 25, 2013

(30) Foreign Application Priority Data

Oct. 19, 2011   (KR) .................. 10-2011-0107057
Jun. 1, 2012   (KR) .................. 10-2012-0059433

(51) Int. Cl.
*H01L 29/20*   (2006.01)
*H01L 29/423*   (2006.01)
(Continued)

(52) U.S. Cl.
CPC ....... *H01L 29/2003* (2013.01); *H01L 29/1029* (2013.01); *H01L 29/1608* (2013.01);
(Continued)

(58) Field of Classification Search
CPC ........... H01L 29/66462; H01L 29/7787; H01L 29/4236; H01L 29/0847; H01L 29/518; H01L 29/0619; H01L 29/105; H01L 29/7786
(Continued)

(56) References Cited

U.S. PATENT DOCUMENTS 7,038,252 B2   5/2006   Saito et al.
2006/0157729 A1*   7/2006   Ueno .................. H01L 29/7786
              257/103
(Continued)

FOREIGN PATENT DOCUMENTS

JP   2010-258441 A   11/2010
JP   2011-044647 A   3/2011
(Continued)

OTHER PUBLICATIONS

Yasuhiro Uemoto et al, "Gate Injection Transistor (GIT)—A Normally-Off AlGaN Power Transistor Using Conductivity Modulation", IEEE Transactions on Electron Devices, vol. 54, No. 12, Dec. 2007; pp. 3393-3399.
(Continued)

*Primary Examiner* — Jerome Jackson, Jr.
*Assistant Examiner* — Fang-Xing Jiang
(74) *Attorney, Agent, or Firm* — Harness, Dickey & Pierce, P.L.C.

(57) ABSTRACT

According to example embodiments a transistor includes a channel layer on a substrate, a first channel supply layer on the channel, a depletion layer, a second channel supply layer, source and drain electrodes on the first channel supply layer, and a gate electrode on the depletion layer. The channel includes a 2DEG channel configured to generate a two-dimensional electron gas and a depletion area. The first channel supply layer corresponds to the 2DEG channel and defines an opening that exposes the depletion area. The depletion layer is on the depletion area of the channel layer. The second channel supply layer is between the depletion layer and the depletion area.

15 Claims, 20 Drawing Sheets

(51) Int. Cl.
*H01L 29/778* (2006.01)
*H01L 29/10* (2006.01)
*H01L 29/16* (2006.01)

(52) U.S. Cl.
CPC .... *H01L 29/42316* (2013.01); *H01L 29/7786* (2013.01); *H01L 29/7789* (2013.01); *H01L 29/42376* (2013.01)

(58) Field of Classification Search
USPC .................. 257/194, E29.246, E29.25, 335
See application file for complete search history.

(56) References Cited

U.S. PATENT DOCUMENTS

| | | | | |
|---|---|---|---|---|
| 2008/0303064 | A1* | 12/2008 | Sato | 257/194 |
| 2009/0057720 | A1* | 3/2009 | Kaneko | 257/194 |
| 2009/0072240 | A1* | 3/2009 | Suh et al. | 257/76 |
| 2010/0102357 | A1* | 4/2010 | Sato | 257/192 |
| 2010/0258848 | A1* | 10/2010 | Lidow et al. | 257/288 |
| 2010/0264461 | A1* | 10/2010 | Rajan et al. | 257/194 |
| 2011/0006346 | A1 | 1/2011 | Ando et al. | |
| 2012/0025270 | A1* | 2/2012 | Chang et al. | 257/194 |

FOREIGN PATENT DOCUMENTS

| | | |
|---|---|---|
| KR | 10-2011-0026798 A | 3/2011 |
| KR | 1020120037315 A | 4/2012 |
| KR | 1020120048244 A | 5/2012 |

OTHER PUBLICATIONS

O. Hilt et al., "Normally-off AlGaN HFET with p-type GaN Gate and AlGaN Buffer", Proceedings of the 22$^{nd}$ International Symposium on Power Semiconductor Devices & IC's, Hiroshima, pp. 347-350.

* cited by examiner

HIGH ELECTRON MOBILITY TRANSISTOR HAVING REDUCED THRESHOLD VOLTAGE VARIATION AND METHOD OF MANUFACTURING THE SAME

CROSS-REFERENCE TO RELATED APPLICATIONS

This application claims priority under 35 U.S.C. §119 to Korean Patent Application No. 10-2011-0107057, filed on Oct. 19, 2011, and Korean Patent Application No. 10-2012-0059433, filed on Jun. 1, 2012 in the Korean Intellectual Property Office, the disclosure of each of which is incorporated herein in its entirety by reference.

BACKGROUND

1. Field

Example embodiments relate to a power device and/or a manufacturing method thereof, and for example, to a high electron mobility transistor having reduced threshold voltage variation and/or a method of manufacturing the same.

2. Description of the Related Art

A high electron mobility transistor (HEMT) may include compound semiconductors having different polarizabilities. A 2-dimensional electron gas (2DEG) may be formed in a channel layer and used as a carrier. When a HEMT includes a thick AlGaN barrier layer, the concentration of 2DEG in a channel layer may increase so that a current during turn-on, that is, an ON current, may increase. Yet, when the thickness of the AlGaN barrier layer is thick, a degree of an energy band of the AlGaN barrier layer being raised by a depletion layer formed between a gate and the AlGaN barrier layer is small. Thus, the 2DEG may not be completely removed from the channel layer under the gate so that an operation of an enhanced mode (E-mode) of the HEMT may be difficult.

Some HEMTs include a recess in the AlGaN barrier layer under the gate. However, the thickness of the AlGaN barrier layer remaining under the recess may vary in an etch process to form the recess. Accordingly, the thickness of the AlGaN barrier layer remaining under the recess may be different for each HEMT. Accordingly, a threshold voltage Vth for turn-on may vary for each HEMT.

SUMMARY

Example embodiments relate to a high electron mobility transistor (HEMT) having reduced threshold voltage variation.

Example embodiments relate to a method of manufacturing a HEMT.

Additional aspects will be set forth in part in the description which follows and, in part, will be apparent from the description, or may be learned by practice of example embodiments.

According to example embodiments, a high electron mobility transistor includes a substrate, a channel layer on the substrate, the channel layer including a 2DEG channel configured to generate a two-dimensional electron gas and a depletion area, a first channel supply layer on the channel layer, the first channel supply layer corresponding to the 2DEG channel and defining an opening that exposes the depletion area, a depletion layer on the first channel supply layer and on the depletion area of the channel layer, a second channel supply layer between the depletion layer and the depletion area, source and drain electrodes spaced apart on the first channel supply layer, and a gate electrode on the depletion layer.

The depletion layer may be one of contacted to and separated from at least one of the source and drain electrodes.

An insulation layer may be between the gate electrode and the depletion layer.

A polarizability of the depletion layer may be less than a polarizability of the first channel supply layer. The depletion layer may include a compound semiconductor layer doped with a p-type dopant.

A polarizability of the depletion layer may be less than a polarizability of the first channel supply layer. A concentration of a polarization generation component may vary according to a thickness of the depletion layer.

The first channel supply layer may contain an n-type dopant and may include at least one of aluminum (Al), gallium (Ga), and indium (In).

A thickness of the first channel supply layer may be about 20 nm to about 200 nm.

A polarizability of the second channel supply layer may be less than a polarizability of the first channel supply layer.

The depletion layer may include at least one of aluminum (Al), gallium (Ga), and indium (In).

The first and second channel supply layers may be compound semiconductor layers having the same elements but different composition ratios.

A thickness of the first channel supply layer may be about 20 nm to about 200 nm, and a thickness of the second channel supply layer may be about 5 nm to about 20 nm.

The first and second channel supply layers may have the same polarizability.

The gate electrode may be a metal or a nitride.

The first and second channel supply layers may have the same polarizability.

According to example embodiments, a method of manufacturing a transistor includes forming a channel layer on a substrate, forming a first channel supply film on the channel layer, the first channel supply film having a polarizability greater than a polarizability of the channel layer, forming a first channel supply layer by removing a part of the first channel supply film, the first channel supply layer defining an opening that exposes a depletion area of the channel layer, forming a second channel supply layer on the first channel supply layer and in the opening, forming a depletion layer on the second channel supply layer, forming source and drain electrodes spaced apart on the first channel supply layer, and forming a gate electrode on the depletion layer.

The method may further include forming an insulation layer between the gate electrode and the depletion layer.

A polarizability of the depletion layer may be less than a polarizability of the first channel supply layer. The depletion layer may include a compound semiconductor layer doped with a p-type dopant.

A polarizability of the depletion layer may be less than a polarizability of the first channel supply layer. A concentration of a polarization generation component of the depletion layer may vary according to a thickness of the depletion layer.

The first channel supply layer may contain an n-type dopant and include at least one of aluminum (Al), gallium (Ga), and indium (In).

The depletion layer may include at least one of aluminum (Al), gallium (Ga), and indium (In).

The first and second channel supply layers may be compound semiconductor layers having the same elements but different composition ratios.

The gate electrode may be a metal or a nitride.

The second channel supply layer and the depletion layer may be formed by an epitaxy method.

The first channel supply layer and the second channel supply layer may have the same polarizability.

A thickness of the first channel supply layer may be about 20 nm to about 200 nm. A thickness of the second channel supply layer may be about 5 nm to about 20 nm.

The gate electrode may include at least one of a metal and a nitride.

The forming the depletion layer may include an epitaxial method.

At least one of the source and drain electrodes may be separated from the depletion layer.

The method may further include reducing a surface roughness of the exposed area of the channel layer prior to forming the depletion layer.

In a HEMT according to example embodiments, after the channel supply layer is formed on the channel layer, a part formed under the gate electrode of the channel supply layer is completely removed. Thereafter, the depletion layer is directly grown by an epitaxy method on the channel layer where the channel supply layer is removed, or the depletion layer is sequentially grown with other channel supply layer having polarizability that is the same or less than that of the channel supply layer.

Since the depletion layer formed in the depletion area under the gate electrode is grown by an epitaxy method or the depletion layer and other channel supply layer are grown by an epitaxy method, the thickness of the material layer formed between the gate electrode and the channel layer may be accurately adjusted. Accordingly, the thickness of the material layer formed between the gate and the channel layer may be maintained constant for each HEMT within a margin of error. Thus, a change in the gate threshold voltage for each HEMT may be reduced (and/or minimized) so that operational reliability of HEMT may be improved.

Further, since the other channel supply layer is grown on the channel supply layer between the gate electrode and the drain electrode, the thickness of the channel supply layer between the gate electrode and the drain electrode become thicker under the gate electrode. Accordingly, even when the depletion layer exists between the gate electrode and the drain electrode, the 2DEG density is not lowered in the channel layer between the gate electrode and the drain electrode.

According to example embodiments, a transistor includes a channel layer including a 2DEG channel configured to generate a two-dimensional electrode gas and a depletion area, a first channel supply layer on the 2DEG channel and defining an opening that exposes the depletion area, a depletion layer on the first channel supply layer and the depletion area, source and drain electrodes spaced apart on the first channel supply layer, and a gate electrode on the depletion layer. The depletion layer may include a compound semiconductor containing nitrogen (N) and at least one of aluminum (Al), gallium (Ga), and Indium (In).

The transistor may include a second channel supply layer between the depletion layer and the depletion area.

A polarizability of the second channel supply may be less than a polarizability of the first channel supply layer.

The transistor may include an insulating layer between the gate electrode and depletion layer.

The depletion layer may further include a p-type dopant.

A polarizability of the depletion layer may be less than a polarizability of the first channel supply layer.

According to example embodiments, a high electron mobility transistor includes a substrate; source, gate and drain electrodes spaced apart on the substrate; a depletion layer over the gate electrode; a first channel supply layer on at least part of the depletion layer; and a channel layer on the depletion layer and the first channel supply layer. The channel layer includes a 2DEG channel corresponding to the first channel supply layer and a depletion area corresponding to the depletion layer.

BRIEF DESCRIPTION OF THE DRAWINGS

These and/or other aspects will become apparent and more readily appreciated from the following description of non-limiting embodiments, as illustrated in the accompanying drawings in which like reference characters refer to the same parts throughout the different views. The drawings are not necessarily to scale, emphasis instead being placed upon illustrate the principles of inventive concepts. In the drawings.

DETAILED DESCRIPTION

Figure 1:
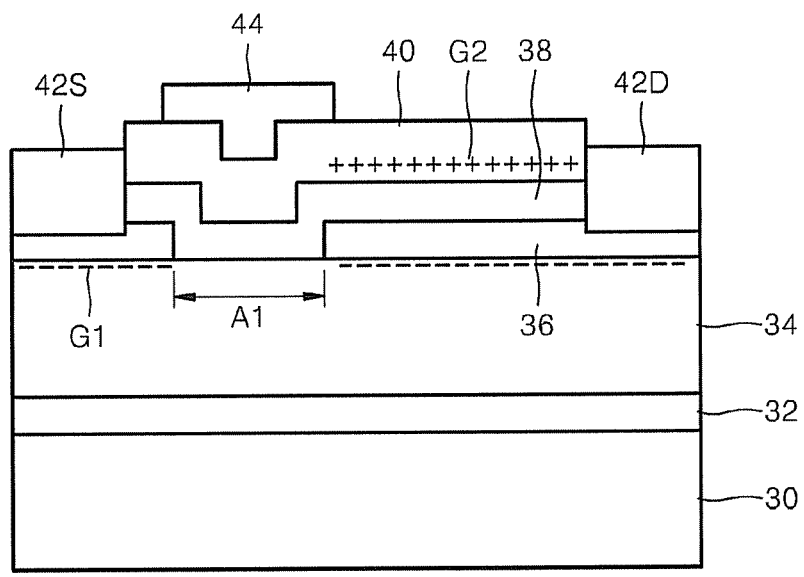
FIG. 1 is a cross-sectional view of a HEMT according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein, the term "and/or" includes any and all combinations of one or more of the associated listed items. Expressions such as "at least one of," when preceding a list of elements, modify the entire list of elements and do not modify the individual elements of the list.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional view of a high electron mobility transistor (HEMT) according to example embodiments. Referring to FIG. 1, a buffer layer 32 is formed on a substrate 30. The substrate 30 may include, for example, a silicon substrate, a silicon carbide (SiC) substrate, or an aluminum oxide (for example, Al2O3) substrate, but example embodiments are not limited thereto. The buffer layer 32 may be a compound semiconductor layer. For example, the buffer layer 32 may be a GaN layer, an AlGaN layer, or an AlGaInN layer. A seed layer may be further provided between the substrate 30 and the buffer layer 32. A material layer 34 containing 2-dimensional electron gas (2DEG) G1 exists on the buffer layer 32. The material layer 34 may be a compound semiconductor layer, for example, a GaN layer. The 2DEG G1 may be located under an upper surface of the material layer 34. The 2DEG G1 may be used as a channel carrier. The material layer 34 includes the 2DEG G1 that is used as a channel carrier. The material layer 34 is hereinafter referred to as a channel layer 34 as a meaning of a material layer including a channel. The 2DEG does not exist in an area A1 under the upper surface of the channel layer 34. The area A1 where the 2DEG is removed is hereinafter referred to as a depletion area A1. A first channel supply layer 36 exists on the channel layer 34. The thickness of the first channel supply layer 36 may be equal to or greater than about 20 nm, for example, about 20 nm to about 200 nm. The thickness of the first channel supply layer 36 may be equal to or less than about 20 nm, for example about 1 nm to about 20 nm. The thickness of the first channel supply layer 36 may be determined according to polarizability of the first channel supply layer 36. The first channel supply layer 36 may be a compound semiconductor layer. The polarizability and band gap of the first channel supply layer 36 may be greater than those of the channel layer 34. The 2DEG G1 is generated in the channel layer 34 according to a difference in the polarizability and band gap between the channel layer 34 and the first channel supply layer 36. A compound semiconductor of the first channel supply layer 36 may be $Al_xGa_{(1-x-y)}In_yN$. Here, x may be defined as $0 < x \leq 1$ and y may be defined as $0 \leq y < 1$, and $0 < x+y \leq 1$. For example, the first channel supply layer 36 may include any one of AlN, AlGaN, AlInN, and AlGaInN. The first channel supply layer 36 exists on the upper surface of the channel layer 34 corresponding to the 2DEG G1. The first channel supply layer 36 does not exist on the depletion area A1 of the channel layer 34. A second channel supply layer 38 covering the channel layer 34 and the depletion area A1 exists on the first channel supply layer 36. The second channel supply layer 38 may cover a partial area of an upper surface of the first channel supply layer 36. Although it is less than the first channel supply layer 36, the second channel supply layer 38 may affect the generation of the 2DEG G1 of the channel layer 34. The thickness of the second channel supply layer 38 may be equal to or less than about 20 nm, for example, thicker than about 1 nm and thinner than about 20 nm, for example thicker than about 5 nm and thinner than about 20 nm.

As the second channel supply layer 38 is provided on the first channel supply layer 36 the thickness of the first and second channel supply layers 36 and 38 may be thicker than the second channel supply layer 38 formed in the depletion area A1. The second channel supply layer 38 in the depletion area A1 has a recess form according to a step of the first channel supply layer 36 at a boundary of the depletion area A1. The second channel supply layer 38 may be a compound semiconductor layer. A compound semiconductor of the second channel supply layer 38 may be $Al_xGa_{(1-x-y)}In_yN$. Here, x may be defined as $0<x\leq1$ and y may be defined as $0\leq y<1$, and $0<x+y\leq1$. The polarizability of the second channel supply layer 38 may be less than that of the first channel supply layer 36. Alternatively, the polarizability of the second channel supply layer 38 may be the same as that of the first channel supply layer 36. The first and second channel supply layers 36 and 38 may be the same compound semiconductor layer. In this case, a content of a particular component, for example, aluminum (Al) or indium (In), of the first and second channel supply layers 36 and 38 may be different from each other. For example, when both of the first and second channel supply layers 36 and 38 are AlGaN layers, the aluminum content of the first channel supply layer 36 may be about 35% and that of the second channel supply layer 38 may be 20%, or vice versa. The first and second channel supply layers 36 and 38 may be doped with an n-type dopant. Silicon (Si) may be used as the n-type dopant and magnesium (Mg) may be used as the p-type dopant, but example embodiments are not limited thereto.

A depletion layer 40 exists on the second channel supply layer 38. The depletion layer 40 may cover the recessed part of the second channel supply layer 38 and the circumference thereof. The overall thickness of the first and second channel supply layers 36 and 38 existing over the 2DEG G1 is thicker than the thickness of the second channel supply layer 38 formed in the depletion area A1 of the channel layer 34. Thus, the influence of the depletion layer 40 is limited to the depletion area A1 and thus the existence of the depletion layer 40 does not affect the density of the 2DEG G1. The thickness of the depletion layer 40 may be 5 to 500 nm.

Although 2DEG is generated in the depletion area A1 of the channel layer 34 by the second channel supply layer 38, the 2DEG is removed by the depletion layer 40. Accordingly, the 2DEG does not exist in the depletion area A1. Even if the 2DEG exists in the depletion area A1, an amount of the 2DEG is very small, compared to that of the 2DEG G1, so that an influence of the 2DEG may be disregarded. The depletion layer 40 may be a compound semiconductor layer or a nitride layer. The compound semiconductor layer may be doped with a p-type dopant such as magnesium, for example, and include any one of a GaN layer, an AlGaN layer, an AlInN layer, an AlInGaN layer, and an InGaN layer. Among these compound semiconductor layers, an InGaN layer may not include a dopant. When the depletion layer 40 is a nitride layer, the depletion layer 40 may be, for example, an InN layer. The InN layer may be doped with a p-type dopant or may not include such a dopant. The depletion layer 40 may include a p-type semiconductor layer or a dielectric layer.

The depletion layer 40 may include a 2-dimensional hole gas (2DHG) G2 according to a difference in the polarizability from the first channel supply layer 36. The second channel supply layer 38 may affect the formation of the 2DHG G2. The 2DHG G2 exists around a boundary surface of the second channel supply layer 38 and the depletion layer 40. When the 2DHG G2 is removed together with the 2DEG G1, space charge of the HEMT of FIG. 1 may generally become neutral. Thus, the HEMT of FIG. 1 may become a super junction HEMT having a very large breakdown voltage.

A source electrode 42S and a drain electrode 42D are formed on the first channel supply layer 36 in an area where the second channel supply layer 38 is not formed. The source electrode 42S and the drain electrode 42D face each other with the depletion area A1 interposed therebetween. The depletion area A1 of the channel layer 34 may be closer to the source electrode 42S than the drain electrode 42D. The source electrode 42S and the drain electrode 42D contact the second channel supply layer 38 and the depletion layer 40. A gate electrode 44 exists on the depletion layer 40. The gate electrode 44 may be disposed in the depletion area A1 of the channel layer 34. The gate electrode 44 may be a metal gate or a nitride gate. When the gate electrode 44 is a metal gate, the gate electrode 44 may be formed of a first metal making an Ohmic contact with the depletion area A1 or a second metal making a Schottky contact with the depletion layer 40. The first metal may be metal having a work function of equal to or greater than 4.5 eV, for example, any one of nickel (Ni), iridium (Ir), platinum (Pt), and gold (Au). The second metal may be metal having a work function of less than 4.5 eV, for example, any one of titanium (Ti), aluminum (Al), hafnium (Hf), tantalum (Ta), and tungsten (W). When the gate electrode 44 is a nitride gate, the gate electrode 44 may be formed of a transition metal nitride. The transition metal nitride may be, for example, TiN, TaN, or WN. Further, the gate electrode 44 may be a gate formed of germanium (Ge) or polysilicon containing conductive impurities.

Figure 2A:
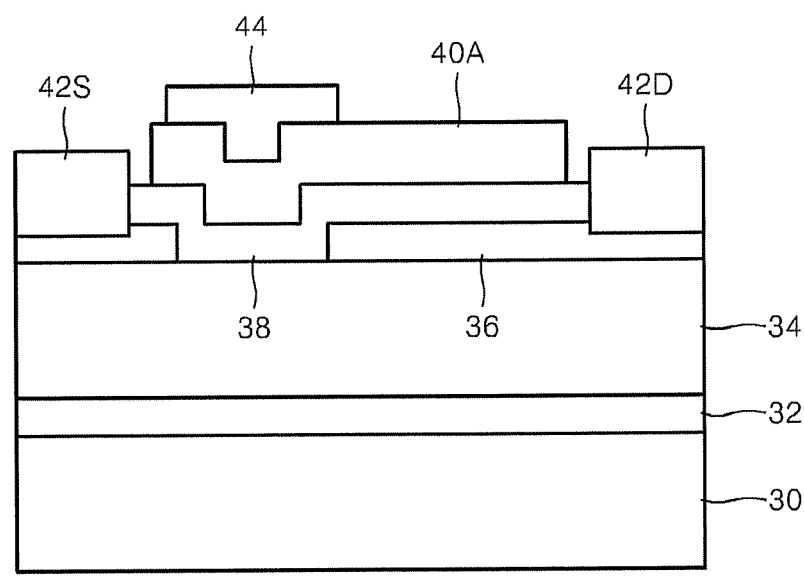
FIGS. 2A to 2C are cross-sectional views illustrating a case where a depletion layer is separated from at least one of the source and drain electrodes in FIG. 1.
Figure 2B:
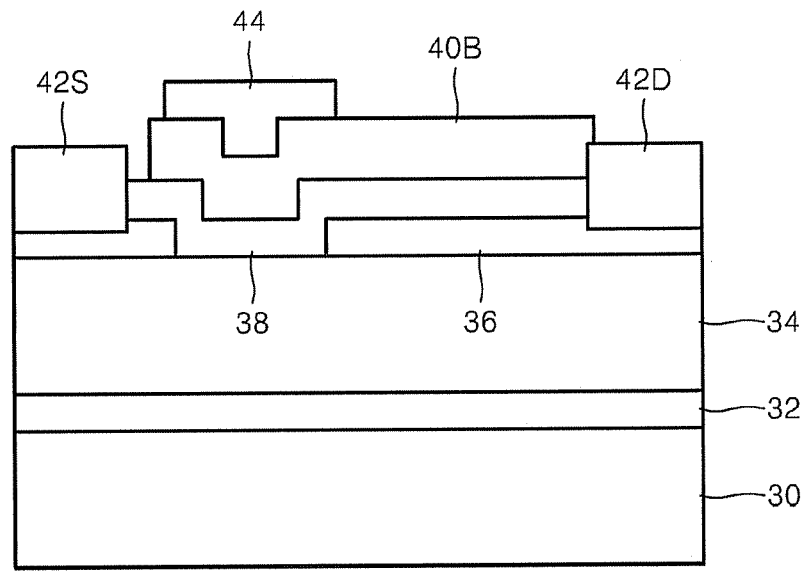
Figure 2C:
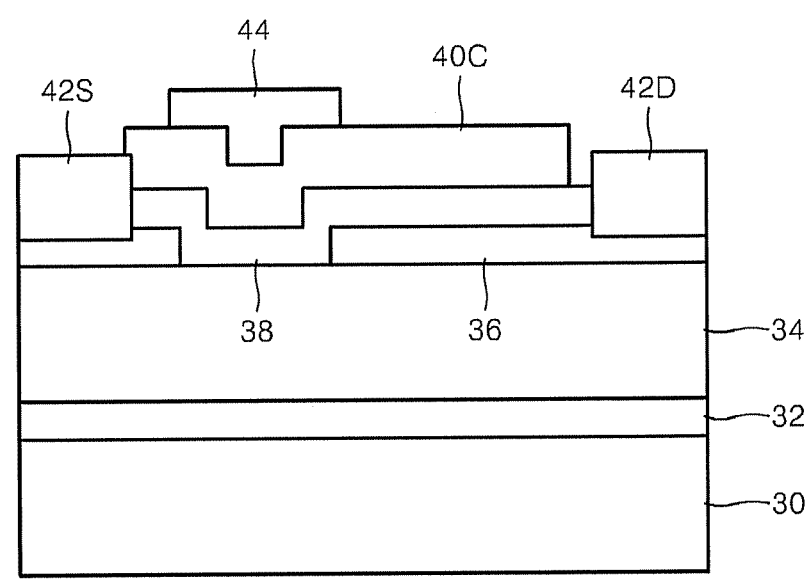
Figure 3:
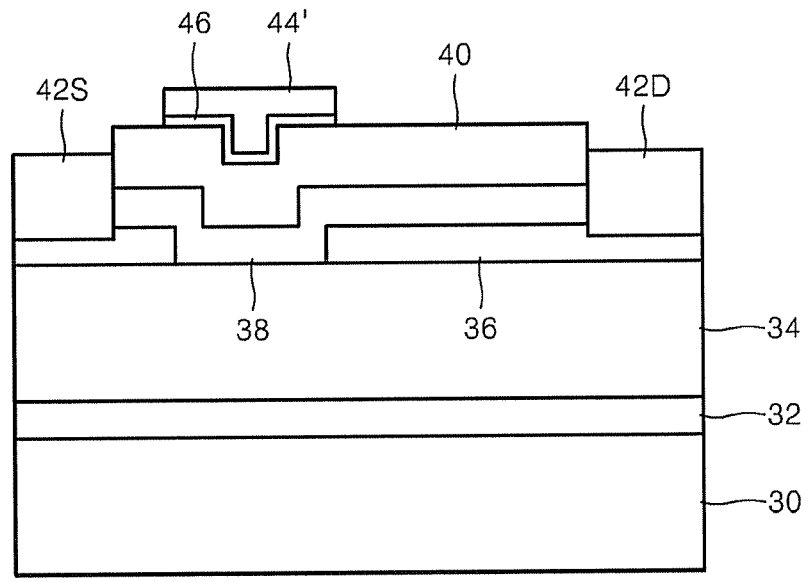
FIG. 3 is a cross-sectional view illustrating a case where an insulation layer (a gate insulation layer) is further provided between the gate and the depletion layer in FIG. 1.

As illustrated in FIG. 2A, the depletion layer 40A may be separated from the source electrode 42S and the drain electrode 42D. Also, as shown in FIG. 2B to 2C, the depletion layer 40B may be separated from the source electrode 42S, but not the drain electrode 42D. Also, as shown in FIG. 2C, the depletion layer 40C may be separated from the drain electrode 42D, but not the source electrode 42S. The source electrode 42S and the drain electrode 42D may include at least one metal or metal nitride, for example at least one of Au, Ni, Pt, Ti, Al, Pd, Ir, W, Mo, Ta, Cu, TiN, TaN, and WN, but example embodiments are not limited thereto. Also, as illustrated in FIG. 3, an insulation layer 46 for reducing (and/or preventing) a leakage current may be further provided between the gate electrode 44' and the depletion layer 40. The insulation layer 46 may be a silicon oxide layer or a nitride layer. The insulation layer 46 may be applied to the HEMT of FIGS. 2A to 2C.

Figure 4:
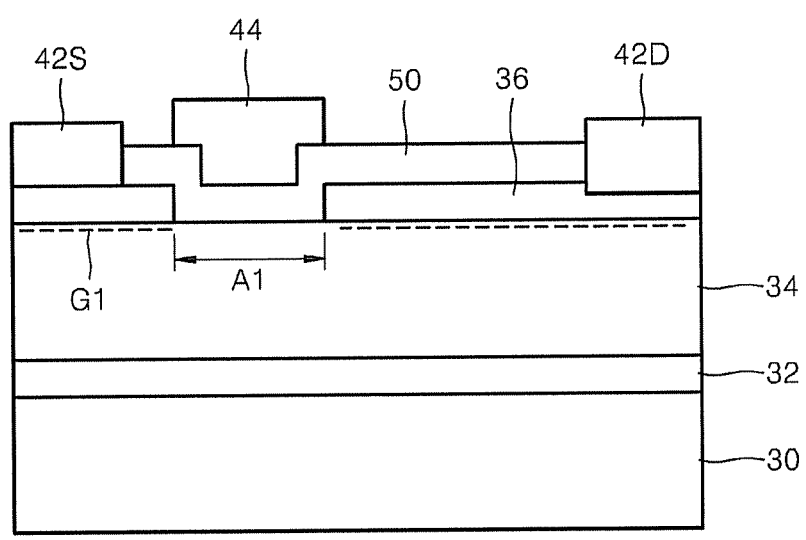
FIG. 4 is a cross-sectional view of a HEMT according to example embodiments.

FIG. 4 is a cross-sectional view of a HEMT according to example embodiments. The following description will focus only on differences from the HEMT illustrated in FIG. 1.

Referring to FIG. 4, a second depletion layer 50 covering the depletion area A1 of the channel layer 34 is provided in a partial area of the first channel supply layer 36. The second depletion layer 50 may have a thickness of 1 to 100 nm. The second depletion layer 50 may be a compound semiconductor layer doped with a p-type dopant, for example, a p-type AlGaN layer. The second depletion layer 50 may be a compound semiconductor layer in which a content of a polarization generation element gradually changes. For example, the second depletion layer 50 may be an AlGaN layer having a p-doping effect in which an aluminum (Al) content gradually decreases from a bottom surface to a top surface so that a polarization density gradually decreases. The second depletion layer 50 may be an AlInN layer or an AlInGaN layer in addition to the AlGaN layer. The second depletion layer 50 may be disposed at the same position as the second channel supply layer 38 of FIG. 1. The source electrode 42S and the drain electrode 42D exist on an upper surface of the first channel supply layer 36 in an area where the second depletion layer 50 does not exist. The source electrode 42S and the drain electrode 42D may contact the second depletion layer 50. The gate electrode 44 exists on the second depletion layer 50.

Figure 5:
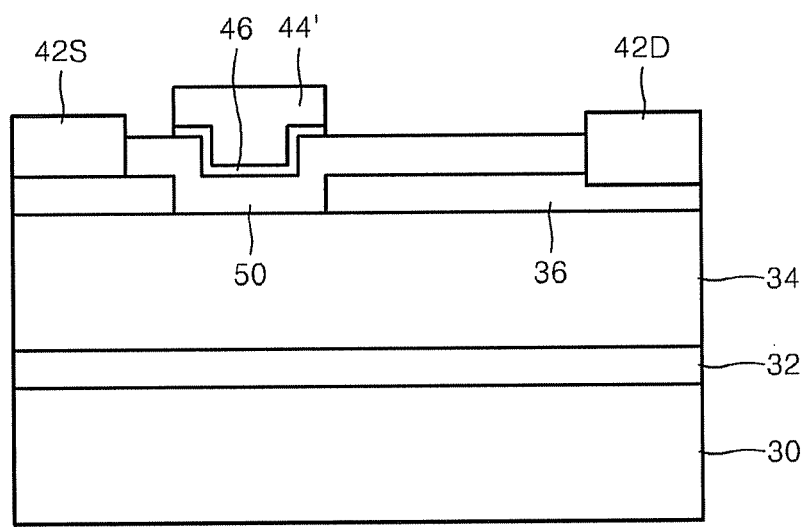
FIG. 5 is a cross-sectional view illustrating a case where an insulation layer (a gate insulation layer) is further provided between the gate and the depletion layer in FIG. 4.

As illustrated in FIG. 5, the insulation layer 46 may be further provided between the second depletion layer 50 and the gate electrode 44'.

Figure 24A:
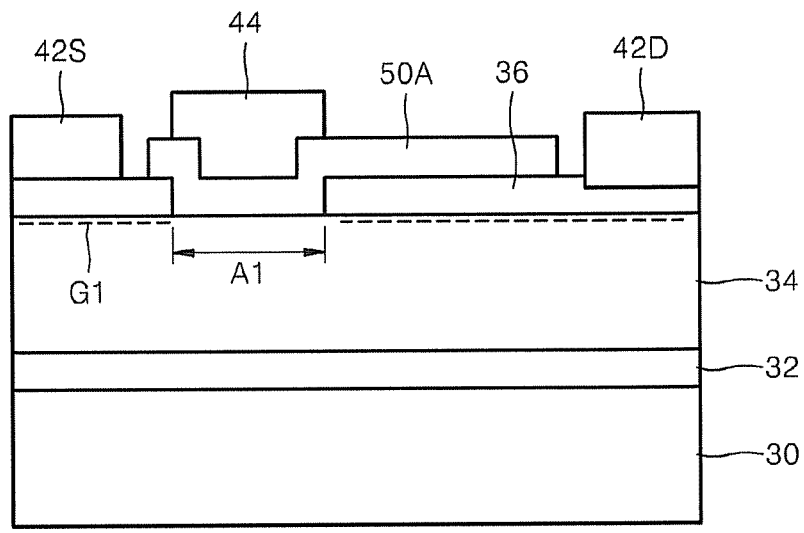
FIGS. 24A to 24C are cross-sectional views illustrating a case where a depletion layer is separated from at least one of the source and drain electrodes in FIG. 1.
Figure 24B:
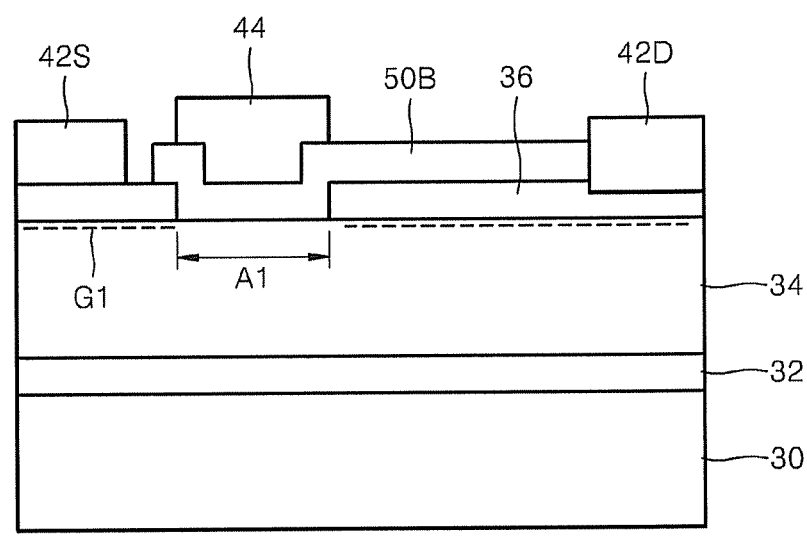
Figure 24C:
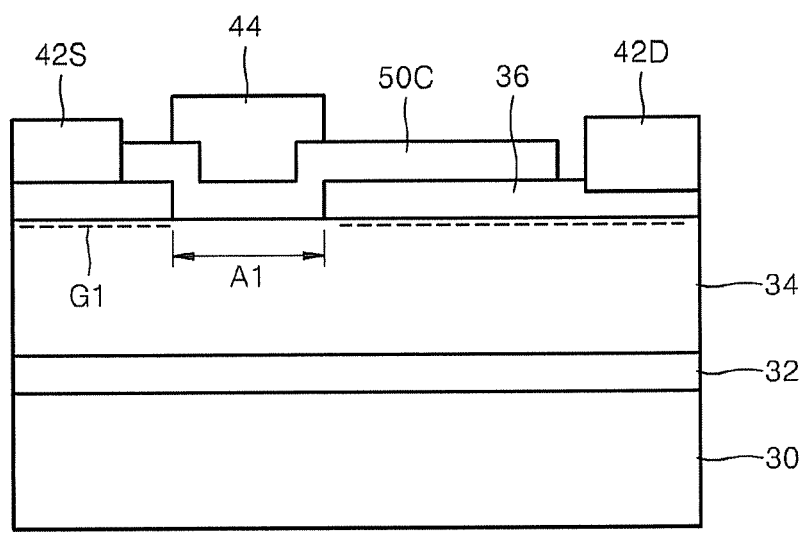

As illustrated in FIG. 24A, the depletion layer 50A may be separated from the source electrode 42S and the drain electrode 42D. Also, as shown in FIG. 24B, the depletion layer 50B may be separated from the source electrode 42S, but not the drain electrode 42D. Also, as shown in FIG. 24C, the depletion layer 50C may be separated from the drain electrode 42D, but not the source electrode 42S.

Referring to FIGS. 6-11, a method of manufacturing a high electron mobility transistor (HEMT) according to example embodiments will be described. In this process, like reference numerals refer to the like elements throughout FIGS. 1-5 and related descriptions are omitted herein.

Figure 6:
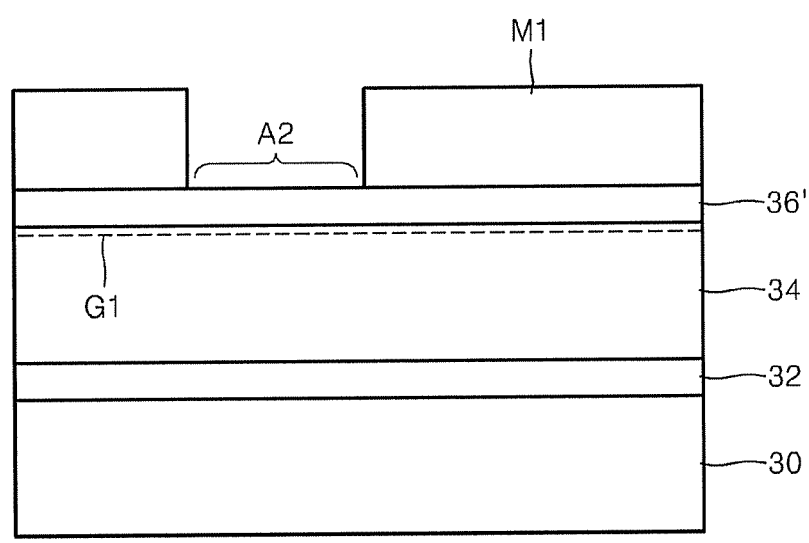
FIGS. 6-12 are cross-sectional views illustrating a method of manufacturing a HEMT by stages, according to example embodiments.

Referring to FIG. 6, the buffer layer 32 is formed on the substrate 30. A seed layer (not shown) may be formed between the substrate 30 and the buffer layer 32. The channel layer 34 is formed on the buffer layer 32. The channel layer 34 may be formed by an epitaxy method. The first channel supply film 36' is formed on the channel layer 34. The 2DEG G1 is generated under an upper surface of the channel layer 34 according to a difference in polarizability between the first channel supply film 36' and the channel layer 34. The first channel supply film 36' may be formed by an epitaxy method. When the first channel supply film 36' is a material layer doped with an n-type dopant such as silicon (Si), the n-type dopant may be doped in a process of growing the first channel supply film 36'. The growth of the first channel supply layer 36' and the injection of the n-type dopant may be performed by an in-situ method. After the first channel supply film 36' is formed, a mask M1 is formed on an upper surface of the first channel supply film 36'. The mask M1 is formed to expose an area A2 that is a part of an upper surface of the first channel supply layer 36'. The area A2 that is a partially exposed area of the upper surface of the first channel supply layer 36' corresponds to the depletion area A1 of the channel layer 34 of FIG. 1. After the mask M1 is formed, the area A2 is removed. Then, the mask M1 is removed.

Figure 7:
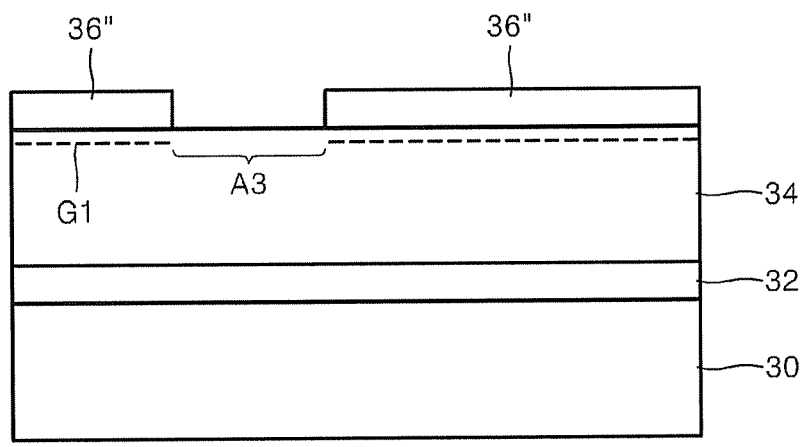

As illustrated in FIG. 7, an area A3 that is a part of an upper surface of the channel layer 34 is exposed. As a part formed in the area A3 that is an exposed area of the channel layer 34 is removed from the first channel supply film 36' to form the first channel supply layer 36", the 2DEG G1 is removed from the area A3 of the channel layer 34. The area A3 of the channel layer 34 corresponds to the depletion area A1 of FIG. 1.

The area A2 of the first channel supply film 36' (see FIG. 6) may be removed by anisotropy dry etching. The roughness of a surface of the area A3 of the channel layer 34 may be increased by the above etching. Thus, a resultant of FIG. 7 is wet etched to reduce the roughness of the surface of the area A3 of the channel layer 34. TMAH or KOH is used as an etchant for the wet etching. The surface roughness (rms) of the area A3 of the channel layer 34 due to the wet etching may be reduced to a level similar to that before the first channel supply film 36' is anisotropically dry etched. For example, while the surface roughness of the upper surface of the channel layer 34 before the anisotropic dry etching is about 1 Å, that of the area A3 of the channel layer 34 after the anisotropic dry etching is increases to about 2 Å. However, after the wet etching, the roughness of the surface of the area A3 of the channel layer 34 is decreased to about 1 Å.

Figure 8:
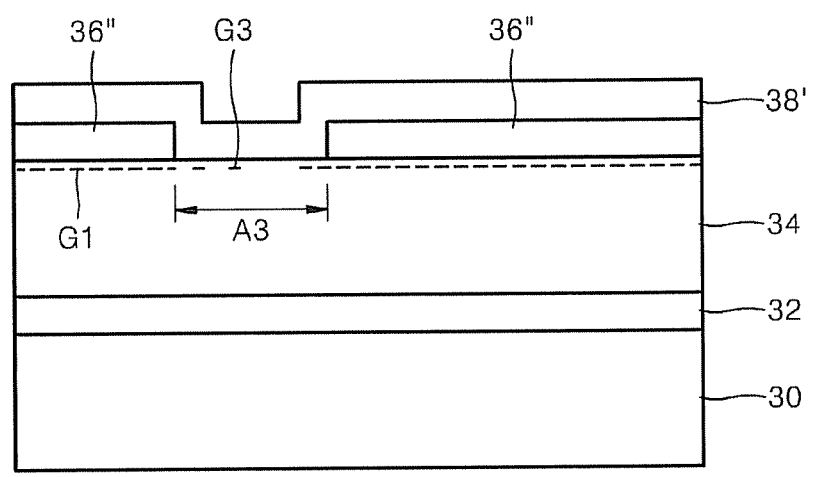

Next, referring to FIG. 8, after the wet etching, the second channel supply layer 38' covering the area A3 of the channel layer 34 is formed on the first channel supply layer 36". The second channel supply layer 38' may be formed by an epitaxy method. Although the second channel supply layer 38' may be formed at the same composition as the first channel supply layer 36", a content of one component of the composition may be different from that of the first channel supply layer 36". For example, the second channel supply layer 38' like the first channel supply layer 36" may be formed by growing the AlGaN layer, in which an Al content may be smaller than that of the first channel supply layer 36". A step exists between the area A3 of the channel layer 34 and the first channel supply layer 36". The step is directly transferred to the second channel supply layer 38'. Accordingly, after the second channel supply layer 38' is formed, the second channel supply layer 38' is formed to be recessed in the area A3 of the channel layer 34. After the second channel supply layer 38' is formed, a second 2DEG G3 may be generated in the area A3 of the channel layer 34 due to a difference in polarizability between the second channel supply layer 38' and the channel layer 34. The density of the second 2DEG G3 is lower than the 2DEG G1 generated in the channel layer 34 under the first channel supply layer 36" due to the first channel supply layer 36".

Figure 9:
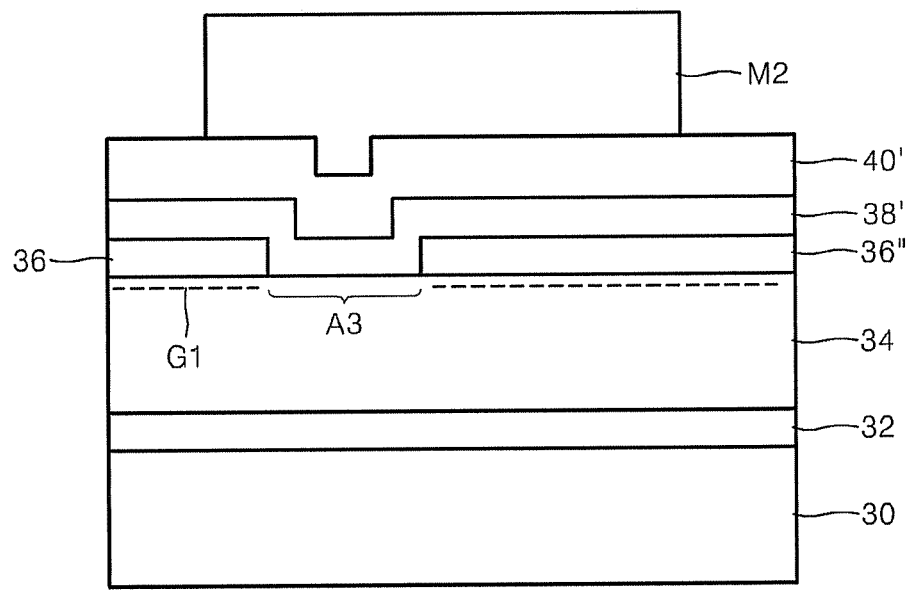

Next, referring to FIG. 9, the depletion layer 40' is formed on the second channel supply layer 38'. The depletion layer 40' may be formed by an epitaxy method. The recess form of the second channel supply layer 38' is transferred to the depletion layer 40'. Accordingly, the depletion layer 40' is formed in the area A3 of the channel layer 34 in a recess form. The second 2DEG G3 generated in the area A3 of the channel layer 34 is removed while the depletion layer 40 is formed.

The mask M2 is formed on the depletion layer 40'. The mask M2 covers the area A3 of the channel layer 34 and a partial area of the depletion layer 40' corresponding to an area around the area A3 of the channel layer 34. An area where source and drain electrodes are formed may be limited by the mask M2.

Figure 10:
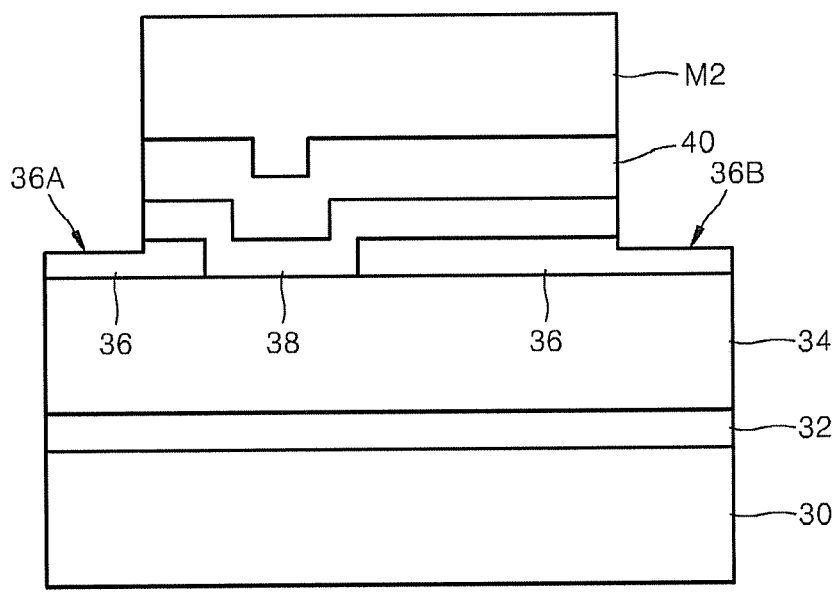
Figure 11:
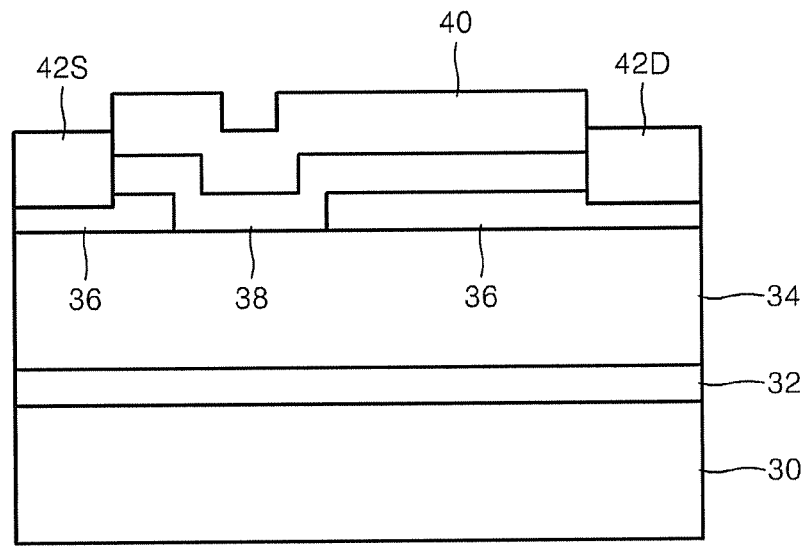

Referring to FIG. 10, the depletion layer 40' and the second channel supply layer 38" around the mask M2 are sequentially etched to form the depletion layer 40 and the second channel supply layer 38. The etching may be performed until the upper surface of the first channel supply layer 36 is exposed. After the etching, the mask M2 is removed. During the etching, a part of the first channel supply layer 36 may be etched. Accordingly, a first area 36A and a second area 36B of the upper surface of the first channel supply layer 36 are exposed. The first area 36A and the second area 36B are separated from each other and face each other with the area A3 of the channel layer 34 interposed therebetween. The first area 36A may be closer to the depletion area A3 than the second area 36B. The source electrode 42S is formed in the first area 36A, and the drain electrode 42D is formed in the second area 36B, as illustrated in FIG. 11. The source and drain electrodes 42S and 42D may be formed by a lift-off method by which an electrode material layer (not shown) is formed on the mask M2 in the first and second areas 36A and 36B before the mask M2 is removed from a resultant of FIG. 10, and then the mask M2 is removed.

Referring to FIG. 11, the source electrode 42S and the drain electrode 42D contact the second channel supply layer 38 and the depletion layer 40.

Figure 12:
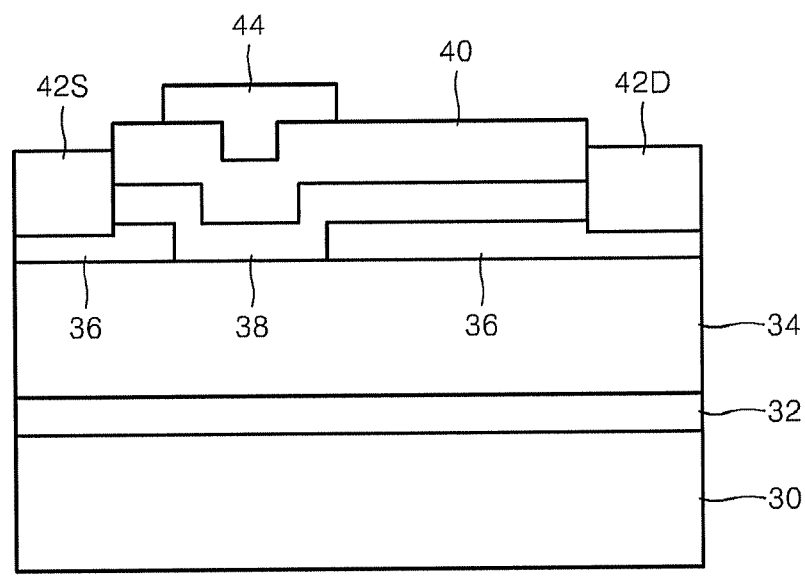

Referring to FIG. 12, the gate electrode 44 is formed on the depletion layer 40. An insulation layer or a gate insulation layer (not shown) may be further formed between the gate electrode 44 and the depletion layer 40.

Next, a method of manufacturing a HEMT of FIG. 2A will be described with reference to FIGS. 13-18. In the following description, different points from the above-described manufacturing method with reference to FIGS. 6-12 will be mainly discussed.

Figure 13:
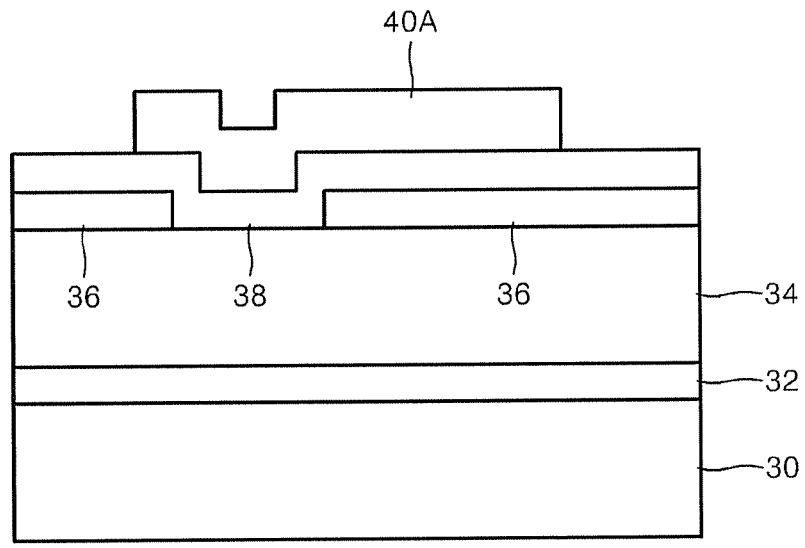
FIGS. 13-18 are cross-sectional views illustrating a method of manufacturing a HEMT by stages, according to example embodiments.

Referring to FIG. 13, the process of forming the buffer layer 32, the channel layer 34, the first channel supply layer 36, and the second channel supply layer 38 on and above the substrate 30 may be the same as that described with reference to FIGS. 6-8.

The depletion layer 40A covering a recessed part of the second channel supply layer 38 and a part around the same is formed on the second channel supply layer 38. The area of the second channel supply layer 38 covered the depletion layer 40A is smaller than that of the second channel supply layer 38 covered by the depletion layer 40 in FIG. 10. In other words, the size of the depletion layer 40A of FIG. 13 is smaller than that of the depletion layer 40 of FIG. 10.

Figure 14:
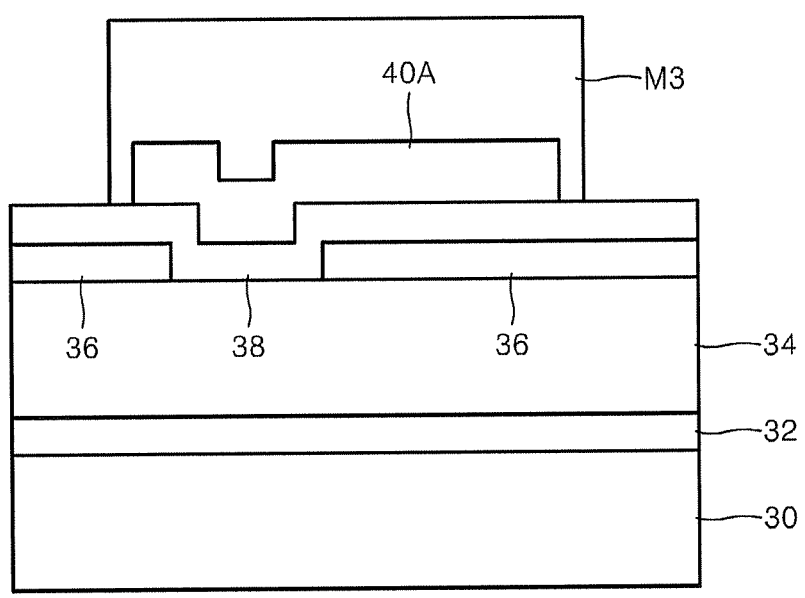
Figure 15:
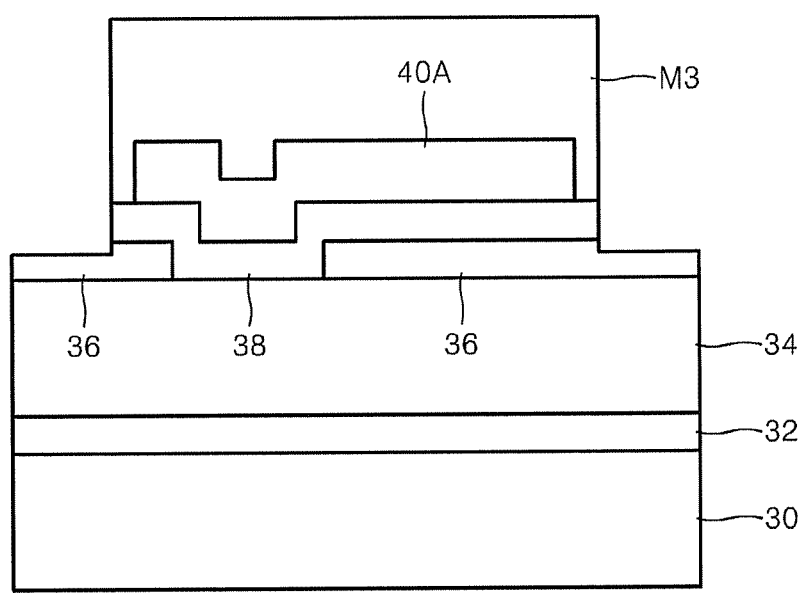

Referring to FIG. 14, a mask M3 covering the depletion layer 40 and a part of the second channel supply layer 38 around the depletion layer 40 is formed on the second channel supply layer 38. Next, the second channel supply layer 38 around the mask M3 is etched as illustrated in FIG. 15, thereby exposing the first channel supply layer 36. After the first channel supply layer 36 is exposed, an exposed part of the first channel supply layer 36 may be further etched within a particular thickness range.

Figure 16:
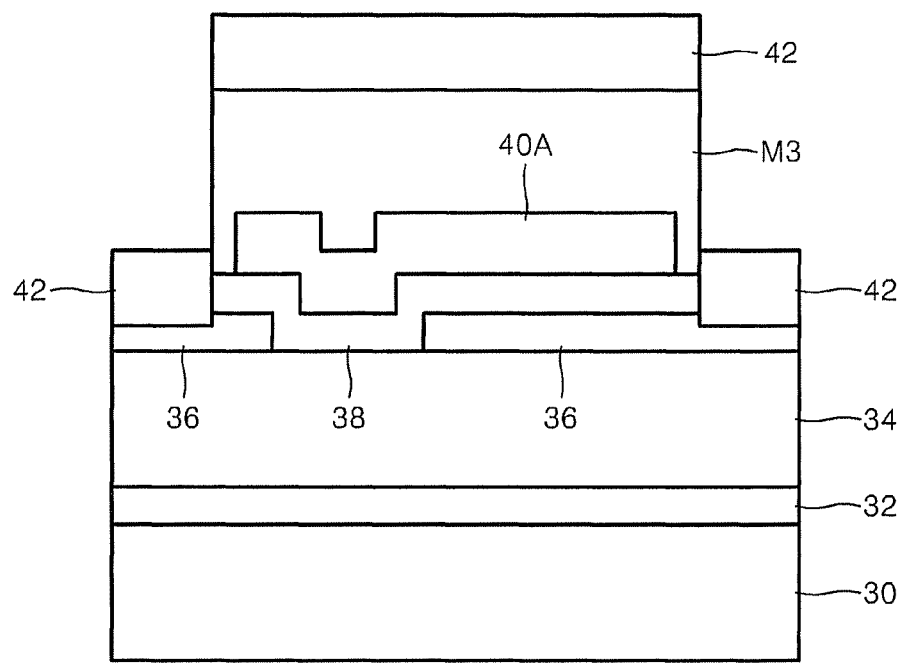
Figure 17:
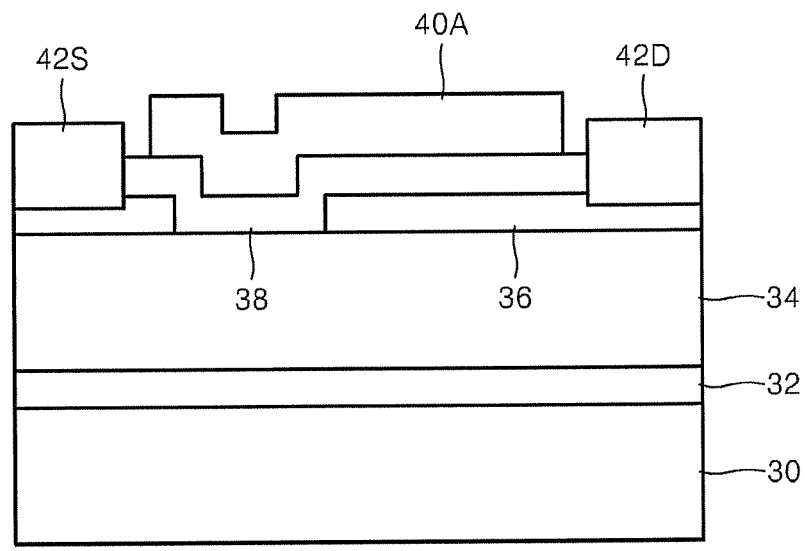
Figure 18:
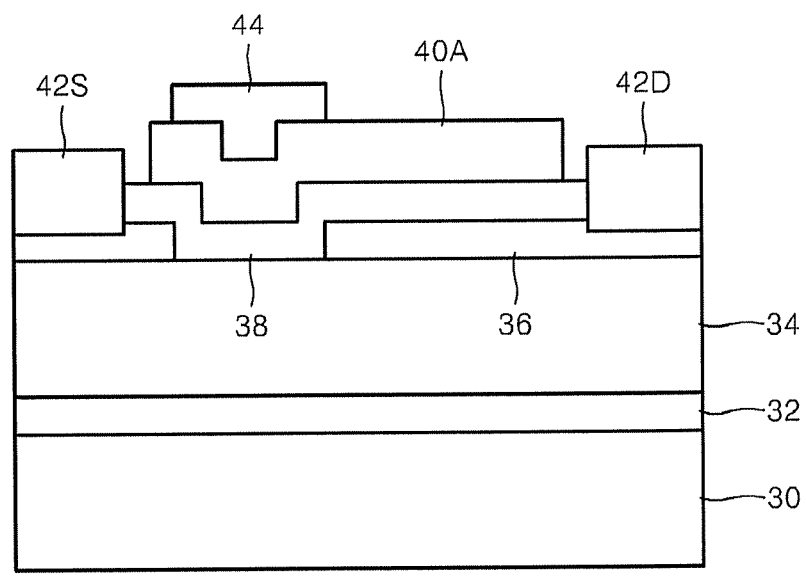

Referring to FIG. 16, a conductive layer 42 is formed in an exposed area of the first channel supply layer 36. The conductive layer 42 may be formed of a material for forming the source and drain electrodes 42S and 42D. The conductive layer is formed on the mask M3 as well. After the conductive layer 42 is formed, the mask M3 is removed. During the removal of the mask M3, a part of the conductive layer 42 formed on the mask M3 is removed. After the mask M3 is removed, the conductive layer 42 remaining at both sides of the depletion layer 40 are used as the source and drain electrodes 42S and 42D as illustrated in FIG. 17. In FIG. 16, the depletion layer 40 and the conductive layer 42 are separated from each other by the mask M3. Accordingly, after the mask M3 is removed, the depletion layer 40 and the source and drain electrodes 42S and 42D are separated from each other as illustrated in FIG. 17. After the mask M3 is removed, the gate electrode 44 is formed on the depletion as illustrated in FIG. 18.

Next, the method of manufacturing a HEMT illustrated in FIG. 4 is described with reference to FIGS. 19-22. Only a different part from the above-described method will be described below.

Figure 19:
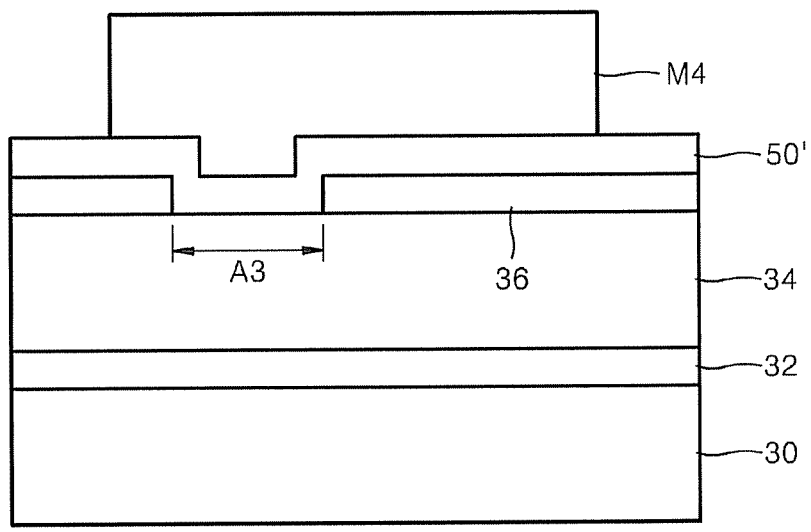
FIGS. 19-22 are cross-sectional views illustrating a method of manufacturing a HEMT by stages, according to example embodiments.
Figure 20:
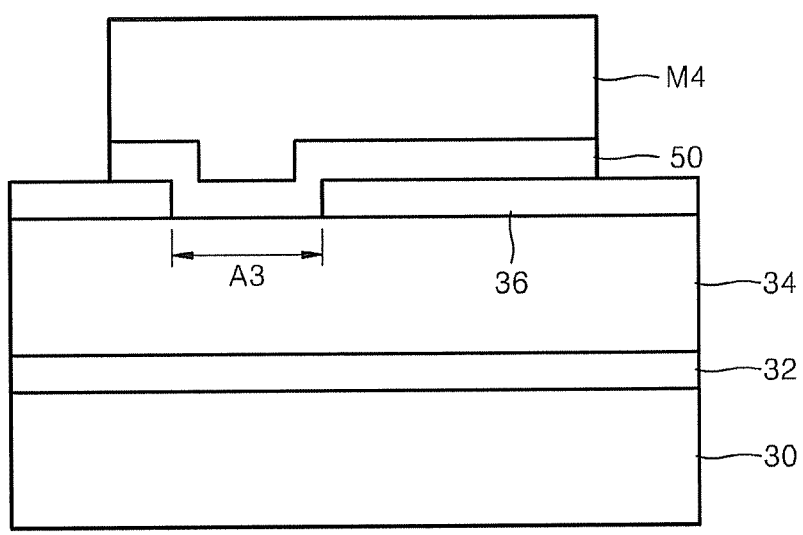

Referring to FIG. 19, the second depletion film 50' covering the exposed area A3 of an upper surface of the channel layer 34 is formed on the first channel supply layer 36. The second depletion film 50' may be formed by an epitaxy method. A part of the second depletion film 50' formed in the exposed area A3 of the channel layer 34 is recessed due to the step of the first channel supply layer 36. The mask M4 is formed on the second depletion film 50'. The mask M4 covers the recessed part of the second depletion film 50' and an area around the same and thus defines areas where the source and drain electrodes are to be formed. After the mask M4 is formed, as illustrated in FIG. 20, the exposed part of the second deletion layer 50 around the mask M4 is etched. The etching is performed until the first channel supply layer 36 is exposed. As a result, the second depletion layer 50 is formed.

Figure 21:
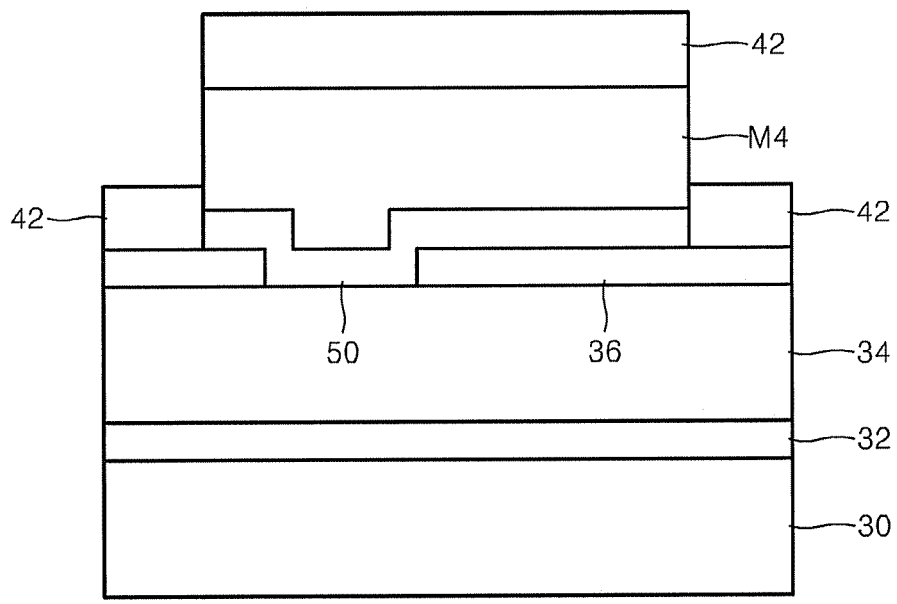
Figure 22:
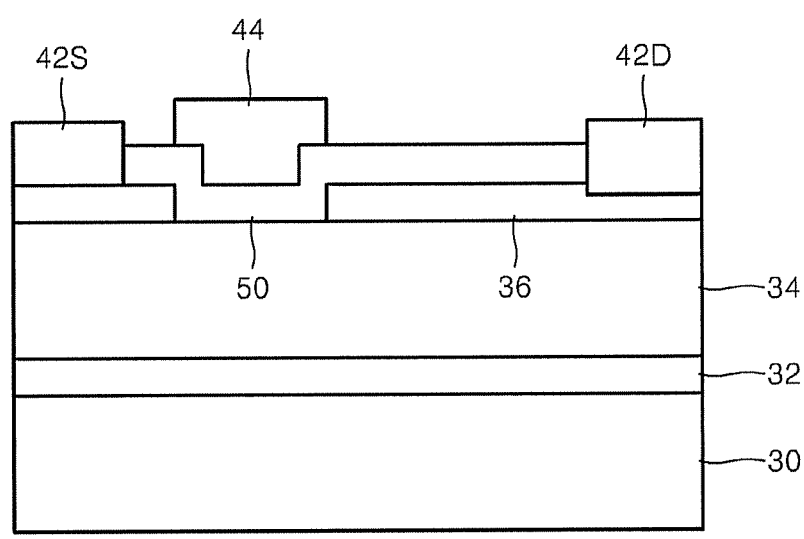

Referring to FIG. 21, the conductive layer 42 is formed in an area of the first channel supply layer 36 exposed by the above etching. The conductive layer 42 is formed on the mask M4. When the mask M4 is removed after the conductive layer 42 is formed, the conductive layer 42 formed on the mask M4 is removed with the mask M4. As such, the conductive layer 42 is left only on the first channel supply layer 36. The conductive layer 42 remaining on the first channel supply layer 36 at both sides of the second depletion layer 50 is used as the source drain 42S and the drain electrode 42D as illustrated in FIG. 22. The conductive layer 42 remaining on the first channel supply layer 36 contacts a side surface of the second depletion layer 50.

After the mask M4 is removed, another mask covering the second depletion layer 50 is formed and then a subsequent process may be performed. By doing so, a HEMT in which the source and drain electrodes 42S and 42D and the second depletion layer 50 are separated from each other may be formed.

Figure 23:
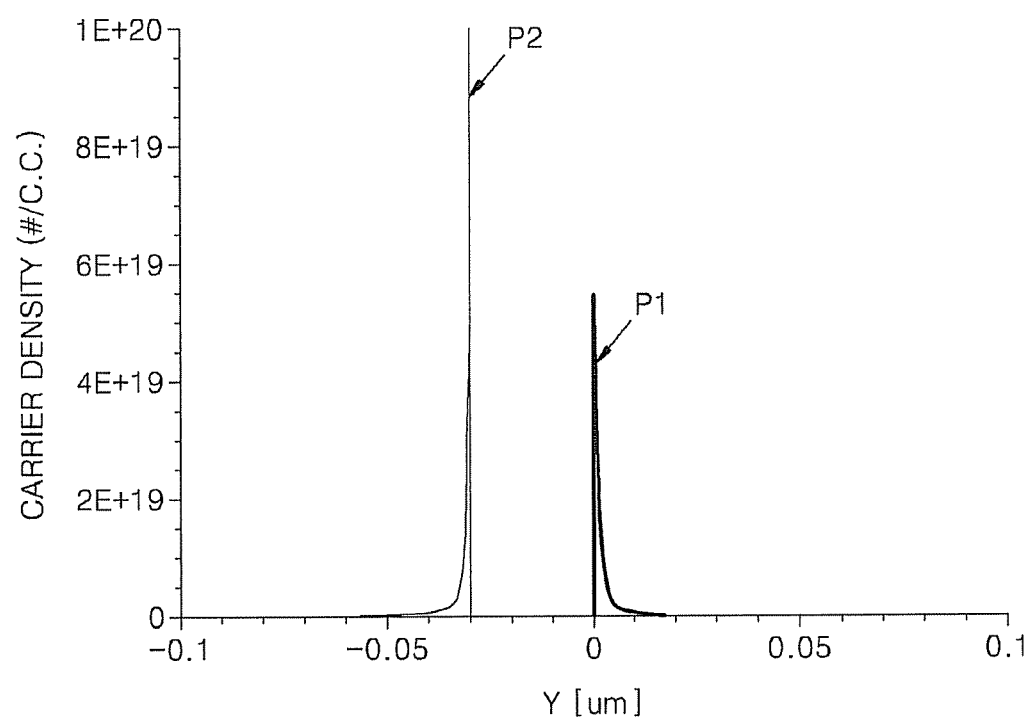
FIG. 23 is a graph showing 2DEG and 2DHG densities between gate and drain electrodes measured by a simulation performed on the HEMT according to example embodiments.

FIG. 23 shows a result of a simulation about the density of the 2DEG G1 and the 2DHG G2 between the gate electrode 44 and the source and drain electrodes 42S and 42D measured when the channel layer 34 is a GaN layer, the first channel supply layer 36 is an $Al_{35}GaN_{15}$ layer or an $Al_{20}GaN_{15}$ layer, the second channel supply layer 38 is an $Al_{20}GaN_{15}$ layer or an Al35GaN15 layer, and the depletion layer 40 is a p-GaN layer. In FIG. 23, a first peak P1 denotes a 2DEG density and a second peak P2 denotes a 2DHG density.

Referring to FIG. 23, when the compositions of the first and second channel supply layers 36 and 38 are the same, it can be seen that the density of the 2DEG and 2DHG are high over about 1018/cm3 even when the composition ratios of the respective layers are different from one another. Thus, when the compositions of the first and second channel supply layers 36 and 38 are the same, by making the composition ratios of the respective layers different from one another, the density of the 2DEG of the channel layer 34 between the gate electrode 44 and the drain electrode 42D may be maintained high and the density of the 2DHG of the depletion layer 40 between the gate electrode 44 and the drain electrode 42D may be maintained high.

Figure 25A:
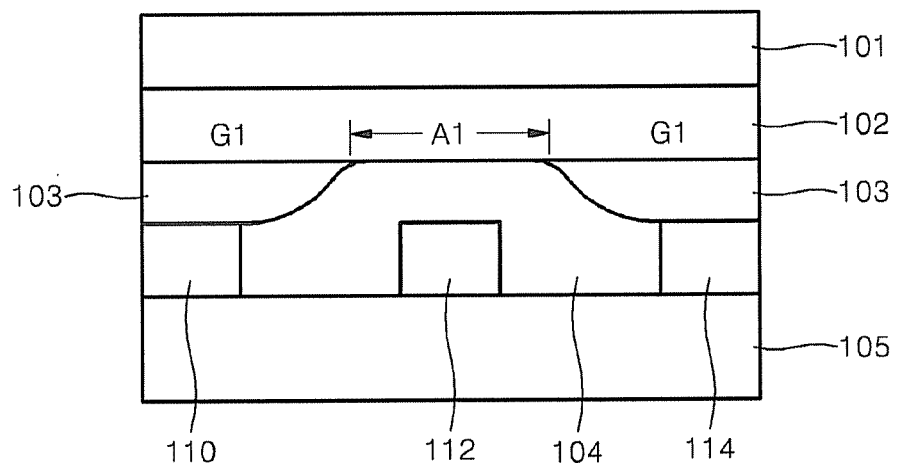
FIGS. 25A to 25B are cross-sectional views that illustrate HEMTs according to example embodiments.
Figure 25B:
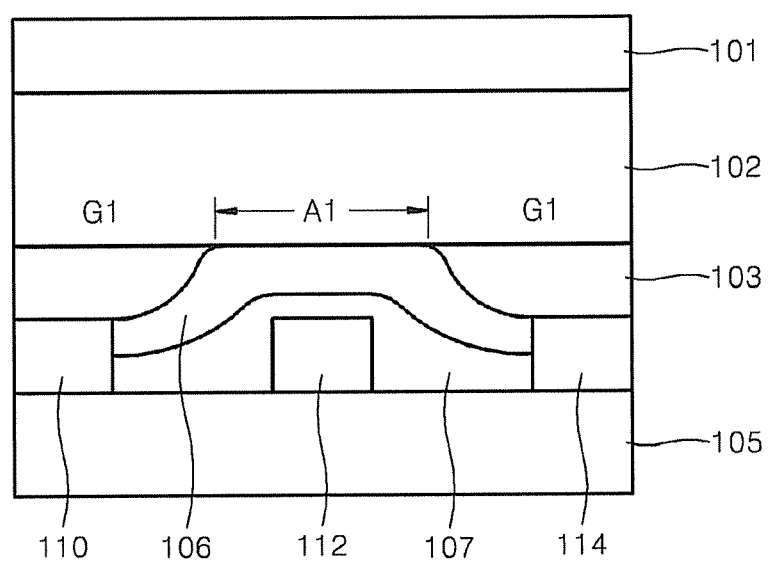

FIGS. 25A to 25B are cross-sectional views that illustrate HEMTs according to example embodiments.

Referring to FIG. 25A, a HEMT according to example embodiments includes a source electrode 110, a gate electrode 112, and a drain electrode 114 spaced apart on a substrate 105. A depletion layer 104 is formed over the gate electrode 112, and a first channel supply layer 103 is formed on sides of the depletion layer 104.

A channel layer 102 and a passivation layer 101 are on the first channel supply layer 103 and the depletion layer 104. As shown in FIG. 25A, the channel layer 102 may include a depletion area A1 at an interface with the depletion layer 104 and include a region G1 at an interface with the first channel supply layer 103 that contains a 2-dimensional electron gas (2DEG).

FIG. 25B is a cross-sectional view of a HEMT according to example embodiments. The following description will focus only on differences from the HEMT illustrated in FIG. 25A.

As illustrated in FIG. 25B, instead of the depletion layer 104, a HEMT according to example embodiments includes a second channel supply layer 106 between a depletion layer 107 and the first channel supply layer 103.

FIGS. 26A to 26G are cross-sectional views illustrating a method of making a HEMT by stages, according to example embodiments.

Figure 26A:
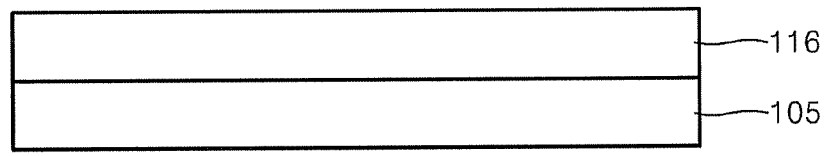
FIGS. 26A to 26G are cross-sectional views illustrating a method of making a HEMT by stages, according to example embodiments.
Figure 26B:
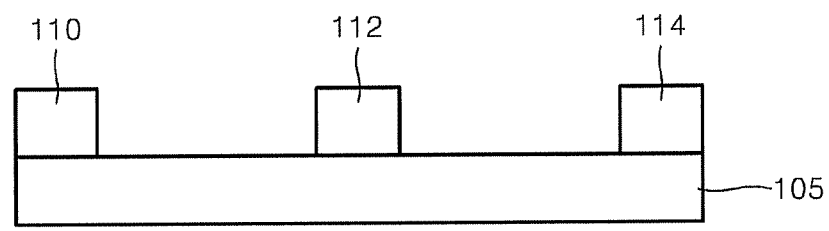
Figure 26C:
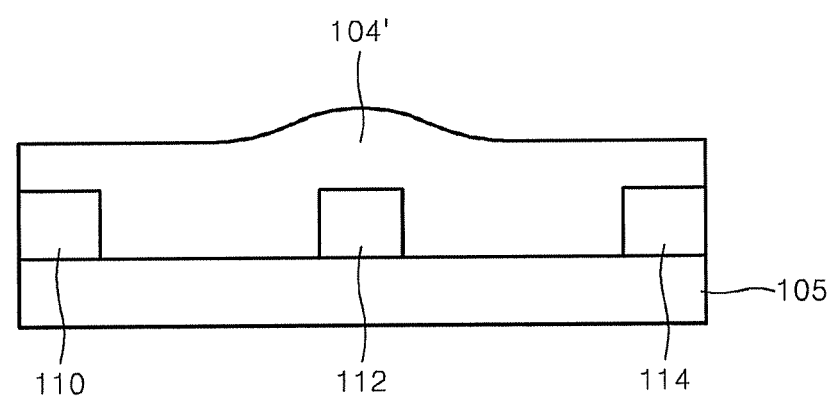

Referring to FIG. 26A, an electrode layer 116 is formed on a substrate 105. The substrate 105 may include, for example, a silicon substrate, a silicon carbide (SiC) substrate, or an aluminum oxide (for example, Al2O3) substrate, but example embodiments are not limited thereto. The electrode layer 116 may include a metal or a metal nitride. As illustrated in FIG. 26B, the electrode layer 116 is patterned into source 110, gate 112, and drain 114 electrodes. As illustrated in FIG. 26C, a depletion film 104' is formed over the source electrode 110, gate electrode 112, and drain 114 electrodes. The depletion film 104' may contain the same material as the depletion layer 50 described above with reference to FIG. 4, but example embodiments are not limited thereto.

Figure 26D:
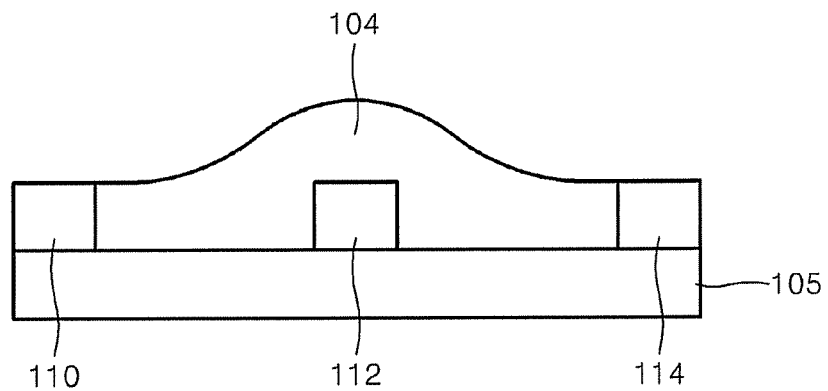
Figure 26E:
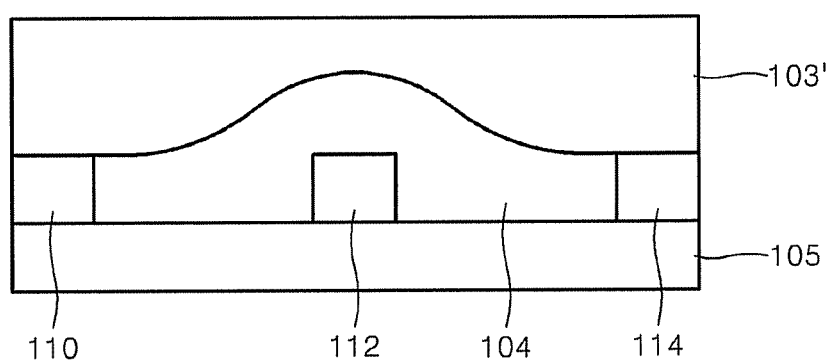
Figure 26F:
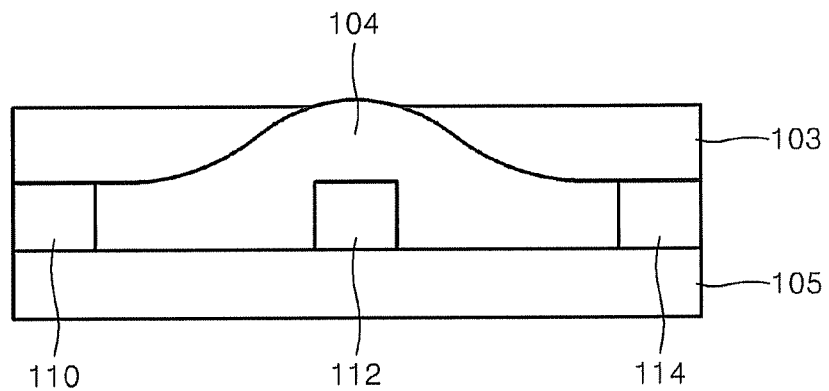
Figure 26G:
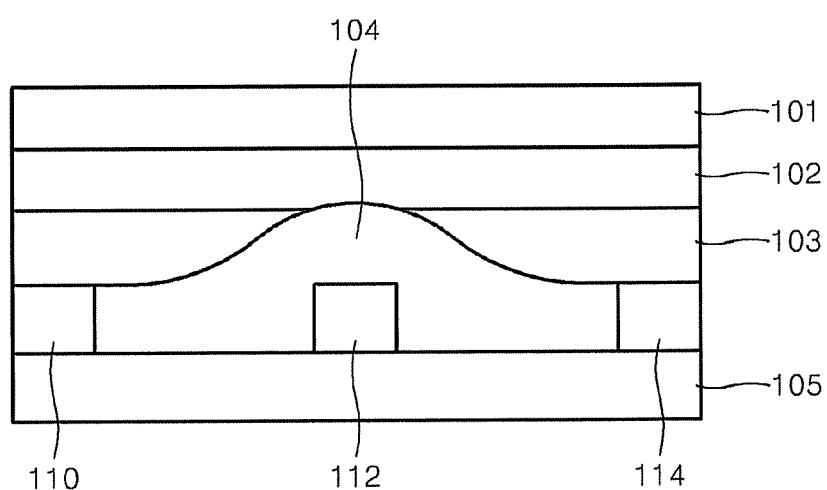

Next, as illustrated in FIG. 26D, a depletion layer 104 is formed by etching back the depletion film 104' formed over the source 110, gate 112, and drain 114 electrodes. As illustrated in FIG. 26E, a first channel supply film 103' is formed over the depletion layer. The first channel supply film 103' may contain the same the material as the first channel supply layer 36 described above with reference to FIG. 4, but example embodiments are not limited thereto. As illustrated in FIG. 26F, a first channel supply layer 103 is formed by etching back the first channel supply film 103'. The first channel supply layer 103 may partially expose the depletion layer 104. Next, as illustrated in FIG. 26G, a channel layer 102 and a passivation layer 101 are sequentially formed over the first channel supply layer 103. The channel layer 102 may contain the same material as the channel layer 34 described above with reference to FIG. 4, but example embodiments are not limited thereto. The passivation layer may contain an insulating material, such as an oxide (e.g., silicon oxide) or an insulating polymer material, but example embodiments are not limited thereto.

While FIGS. 26A to 26G illustrate a method according to example embodiments of forming a HEMT that includes a depletion layer 104, one having ordinary skill in the art would appreciate that a depletion layer 107 may be formed on a second channel supply layer 106 (as shown in FIG. 25B) instead of forming the depletion layer 104. Referring to FIG. 25B, the second channel supply layer 106 and the depletion layer 107 may include the same materials as the second channel supply layer 38 and depletion layer 40, respectively, as described above with reference with FIG. 1.

While some example embodiments have been particularly shown and described, it will be understood by one of ordinary skill in the art that variations in form and detail may be made therein without departing from the spirit and scope of the claims. Descriptions of features or aspects of some HEMTs according to example embodiments should typically be considered as available for other similar features or aspects in other HEMTs according example embodiments.

What is claimed is:

1. A high electron mobility transistor, comprising:
   a substrate;
   a channel layer on the substrate,
      the channel layer being a GaN layer,
      the channel layer including a 2DEG channel and a depletion area;
   a first channel supply layer on the channel layer and corresponding to the 2DEG channel,
      the first channel supply layer defining an opening that exposes the depletion area;
   a depletion layer on the first channel supply layer and on the depletion area;
   a second channel supply layer between the depletion layer and the depletion area,
      the second channel supply layer including a portion that is on an upper surface of the first channel supply layer and extends over the 2DEG channel,
      an aluminum (Al) content of the second channel supply layer being different from an aluminum (Al) content of the first channel supply layer,
      a polarizability of the second channel supply layer being less than a polarizability of the first channel supply layer, and
      the first and second channel supply layers both including an aluminum compound;
   source and drain electrodes spaced apart on the first channel supply layer; and
   a gate electrode on the depletion layer, wherein
   the depletion layer is not directly in contact with the first channel supply layer, and
   the depletion layer is configured to remove a 2DEG that is generated in the depletion area of the channel layer by the second channel supply layer.

2. The transistor of claim 1, wherein the depletion layer contacts at least one of the source and drain electrodes.

3. The transistor of claim 1, further comprising:
   an insulation layer between the gate electrode and the depletion layer.

4. The transistor of claim 1, wherein
   a polarizability of the depletion layer is less than a polarizability of the first channel supply layer,
   the depletion layer includes a compound semiconductor layer doped with a p-type dopant.

5. The transistor of claim 1, wherein
   a polarizability of the depletion layer is less than a polarizability of the first channel supply layer and
   a concentration of a polarization generation component in the depletion layer varies according to a thickness of the depletion layer.

6. The transistor of claim 1, wherein
   the first channel supply layer contains an n-type dopant, and
   the first channel supply layer comprises at least one of aluminum (Al), gallium (Ga), and indium (In).

7. The transistor of claim 1, wherein a thickness of the first channel supply layer is about 20 nm to about 200 nm.

8. The transistor of claim 1, wherein
   a polarizability of the second channel supply layer is less than a polarizability of the first channel supply layer.

9. The transistor of claim 8, wherein
   the depletion layer includes at least one of aluminum (Al), gallium (Ga), and indium (In).

10. The transistor of claim 8, wherein
    the first and second channel supply layer are compound semiconductor layers having the same elements but different composition ratios.

11. The transistor of claim 8, wherein
    a thickness of the first channel supply layer is about 20 nm to about 200 nm and,
    a thickness of the second channel supply layer is about 5 nm to about 20 nm.

12. The transistor of claim 1, wherein the gate electrode includes at least one a metal and a nitride.

13. The transistor of claim 1, wherein the second channel supply layer includes at least one of:
    a lower pair of sidewalls that extend perpendicular from the channel layer and are between a corresponding pair sidewalls in the first channel supply layer; and
    an upper pair sidewalls that extend perpendicular from the first channel supply layer and contact the source and drain electrodes, respectively.

14. The transistor of claim 13, wherein the second channel supply layer includes both the lower pair of sidewalls and the upper pair of sidewalls.

15. The transistor of claim 1, wherein the depletion layer is separated from at least one of the source and drain electrodes.

\* \* \* \* \*